United States Patent
Chou et al.

(10) Patent No.: US 6,573,124 B1
(45) Date of Patent: Jun. 3, 2003

(54) PREPARATION OF PASSIVATED CHIP-ON-BOARD ELECTRONIC DEVICES

(75) Inventors: Shih Chou, Cerritos, CA (US); Steven R. Felstein, Redondo Beach, CA (US); Ching P. Lo, Rancho Palos Verdes, CA (US); Daniel A. Huang, Canoga Park, CA (US); Richard Fanucchi, Fountain Valley, CA (US); Gregory L. Mayhew, El Segundo, CA (US); Lydia H. Simanyi, deceased, late of Santa Ana, CA (US), by Attila Simanyi, administrator

(73) Assignee: Hughes Electronics Corp., Los Angeles, CA (US)

( * ) Notice: Subject to any disclaimer, the term of this patent is extended or adjusted under 35 U.S.C. 154(b) by 0 days.

(21) Appl. No.: 09/304,459

(22) Filed: May 3, 1999

(Under 37 CFR 1.47)

(51) Int. Cl.[7] .............................................. H01L 21/48
(52) U.S. Cl. ...................... 438/126; 438/127; 29/527.2; 29/841; 29/855
(58) Field of Search ............................. 257/784, 788, 257/790, 793, 629, 632, 635, 642, 643, 649; 438/112, 124, 127, 106, 125, 126; 29/825, 832, 829, 841, 854, 855, 856, 592, 527.1, 527.2; 156/60, 305

(56) References Cited

U.S. PATENT DOCUMENTS

| | | | |
|---|---|---|---|
| 4,173,664 A | * | 11/1979 | Cieloszyk .................... 427/385 |
| 4,953,005 A | | 8/1990 | Carlson et al. |
| 5,086,018 A | | 2/1992 | Conru et al. |
| 5,151,559 A | | 9/1992 | Conru et al. |
| 5,274,913 A | | 1/1994 | Grebe |
| 5,475,417 A | * | 12/1995 | Ogata et al. ................. 347/244 |
| 5,506,446 A | | 4/1996 | Hoffman et al. |
| 5,622,898 A | * | 4/1997 | Zechman .................... 438/127 |
| 5,656,830 A | * | 8/1997 | Zechman .................... 257/784 |
| 5,753,974 A | * | 5/1998 | Masukawa .................. 257/737 |
| 5,824,568 A | * | 10/1998 | Zechman .................... 438/112 |
| 5,851,664 A | * | 12/1998 | Bennett et al. ............. 428/355 |
| 5,928,598 A | * | 7/1999 | Anderson et al. ........... 264/446 |
| 5,945,605 A | * | 8/1999 | Julian et al. ................... 73/727 |
| 5,951,813 A | * | 9/1999 | Warren ........................ 156/305 |
| 6,037,044 A | * | 3/2000 | Giri et al. .................... 428/209 |
| 6,110,537 A | * | 8/2000 | Heffner et al. .............. 427/448 |
| 6,140,144 A | * | 10/2000 | Najafi et al. ................... 438/53 |
| 6,184,121 B1 | * | 2/2001 | Buchwalter et al. ........ 438/622 |
| 6,245,663 B1 | * | 6/2001 | Zhao et al. ................. 438/622 |

FOREIGN PATENT DOCUMENTS

| | | | |
|---|---|---|---|
| FR | WO 92/17905 | * | 10/1992 |
| JP | 3-171655 | * | 7/2001 |

* cited by examiner

*Primary Examiner*—David L. Talbott
*Assistant Examiner*—Alonzo Chambliss
(74) *Attorney, Agent, or Firm*—John R. Rafter; Terje Gudmestad

(57) ABSTRACT

A chip-on-board electronic device includes an electronic device die affixed to a printed circuit board, and electrically interconnected thereto by wirebonds. The electronic device is protected by coating it with a layer of silicon oxynitride and, optionally, an overlying thin layer of a conformal coating such as parylene. Under some circumstances, a protective layer of an organic material may be used instead of the layer of silicon oxynitride. The chip-on-board electronic device may be protected with an overlying layer of the conformal coating.

17 Claims, 4 Drawing Sheets

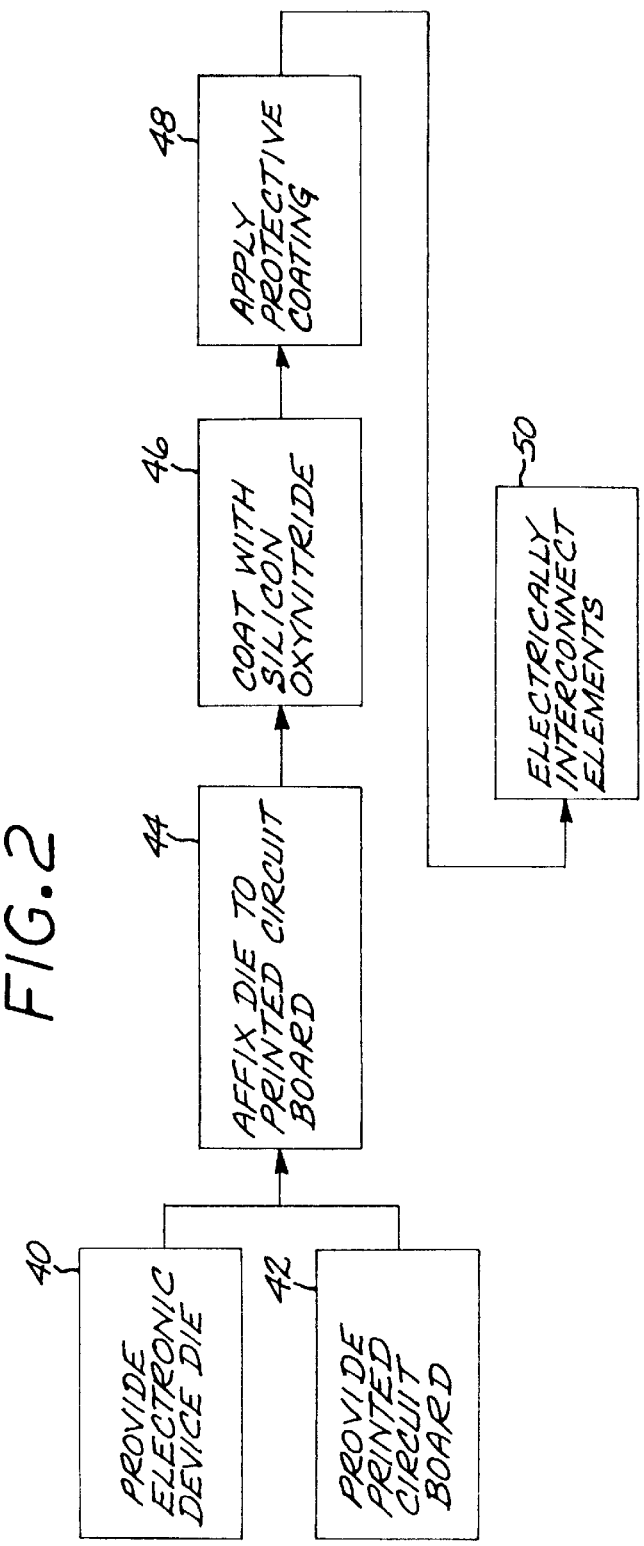

X=H OR HALOGEN

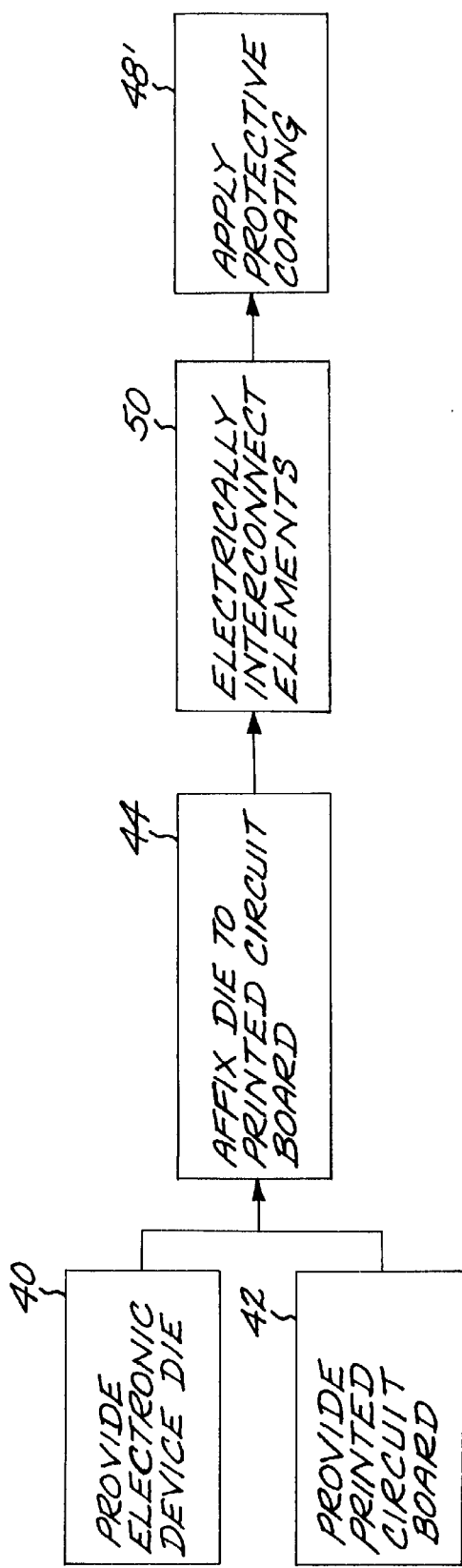
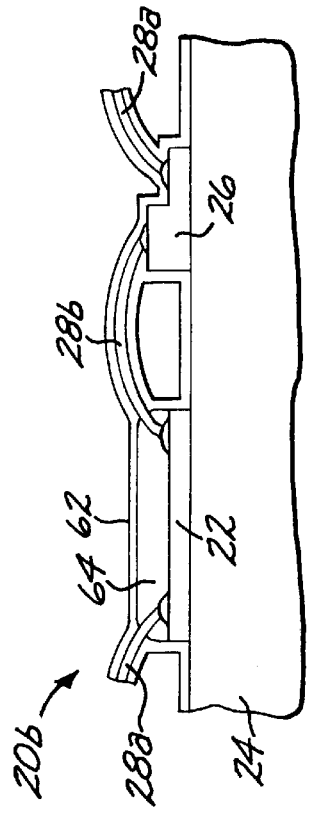
FIG. 5
FIG. 6

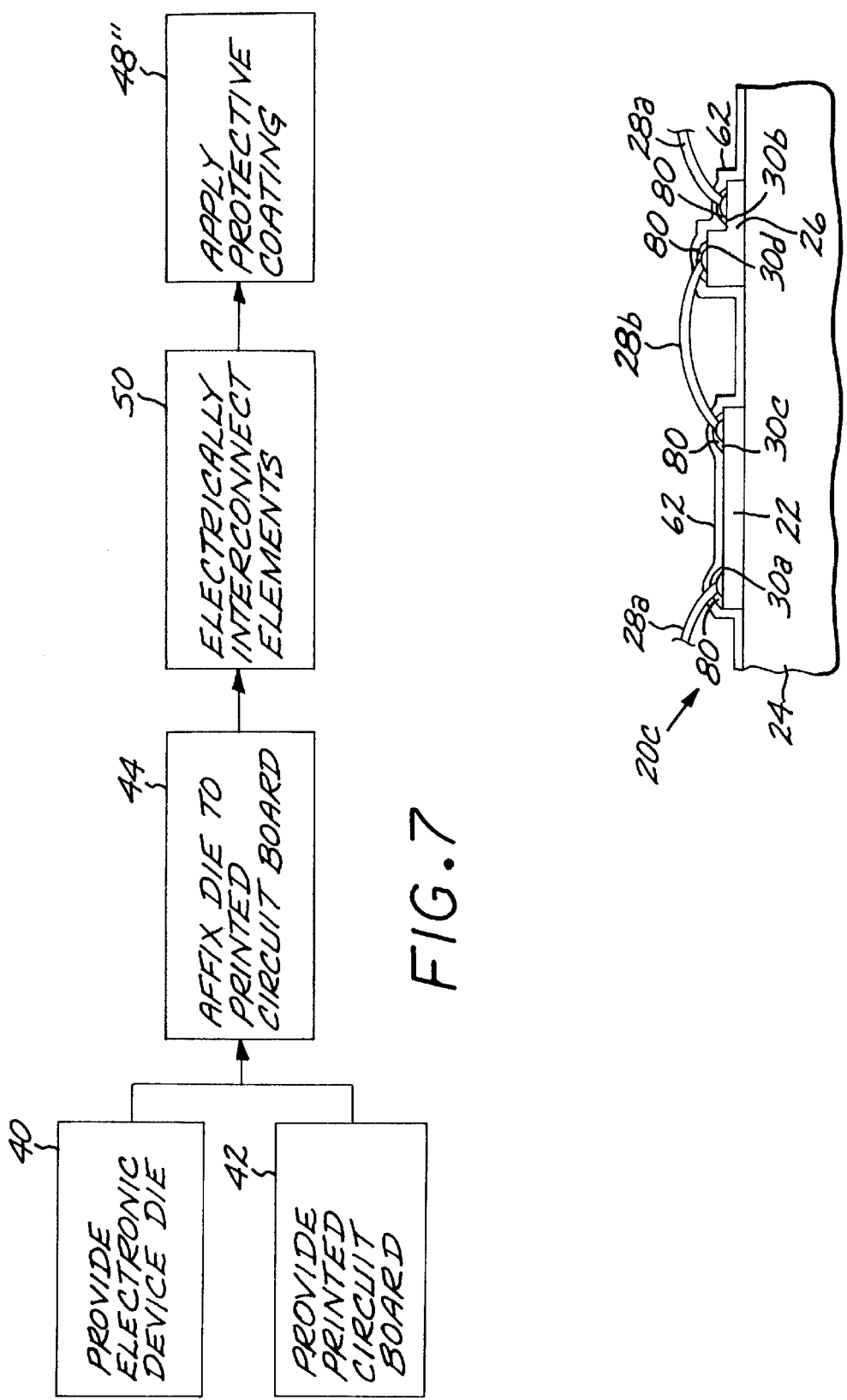

PREPARATION OF PASSIVATED CHIP-ON-BOARD ELECTRONIC DEVICES

BACKGROUND OF THE INVENTION

This invention relates to electronic devices, and, more particularly, to the protection of such devices against damage from external environmental effects.

Microelectronic devices are typically fabricated as an array of active and passive elements on a substrate, sometimes termed a die. The electronic elements may be in planar microchip form or discrete elements, or both. The die must be supported, and, for some applications, the electronic elements protected against physical and chemical damage arising from external sources.

In one widely used approach, the device is encapsulated inside a hermetically sealed package, made of a material such as aluminum oxide, and having electrical leads extending through the walls of the package. The package protects the device against extremely aggressive physical and chemical environments. On the other hand, package structures are relatively expensive, heavy, and bulky. It may be difficult and time consuming to make the attachments to the electrical leads. The packages are potentially subject to leaking over the course of their service lives. Replacement or repair of devices within the package is difficult.

In another approach, the die is mounted to a printed circuit board, and the electrical interconnections are achieved using wirebonding procedures. This approach is quite popular and is used in many consumer electronics products. Manufacturing costs are considerably lower than for packaged devices, size and weight are reduced, and components may be easily tested and replaced if necessary during fabrication or service. This latter approach has the disadvantage that the electronic device is not well protected against external influences such as corrosion. For most consumer products, the corrosive effects are of relatively minor significance, as failed devices may be readily replaced.

Electronic devices placed into space aboard satellites or other spacecraft must remain reliable for many years. The ambient atmosphere in space is relatively benign in respect to corrosion. The protection afforded by hermetic packages is not required and is preferably not utilized due to the other disadvantages of hermetic packages, but it is necessary to provide a moderate degree of protection. Additionally, the device and its protection must withstand the loads and vibrations produced during the launch and maneuvering of the spacecraft.

There is a need for an improved approach to the support, interconnection, and passivation of electronic devices for use in environments which are relatively benign in respect to corrosion. The present invention fulfills this need, and further provides related advantages.

SUMMARY OF THE INVENTION

The present invention provides a method of preparing an electronic device assembly having a die mounted to a support, termed a "chip-on-board" device. The device is relatively inexpensive in its support approach, yet provides a moderate degree of protection for the electronic components that is fully sufficient for many applications such as spacecraft electronics. The protective technique is compatible with the use of fine-wire wirebonds, wherein the wires are about 0.001 inch in diameter or smaller in size. The protection is inexpensive and readily furnished, adds little weight, and permits repair and/or replacement of components as may be necessary.

In accordance with the invention, a method of preparing a chip-on-board electronic device assembly comprises the steps of providing an electronic device die having an electronic circuit element thereon, wherein the electronic circuit element has a die electrical bonding pad thereon, and providing a printed circuit board having a circuit board electrical bonding pad thereon. The die is affixed to the printed circuit board. At least a portion of the die is coated with a layer of silicon oxynitride, and the die electrical bonding pad and the circuit board electrical bonding pad are electrically interconnected with a wire. The coating is performed before the die is affixed to the printed circuit board.

Optionally but preferably, a thin layer of a conformal coating material such as parylene is applied overlying the layer of silicon oxynitride. The coating is preferably from about 0.1 to about 0.5 micrometers thick, and is applied by a technique such as plasma enhanced chemical vapor deposition (PECVD) that does not disturb the wires of the wirebonds.

In a variation of this approach, the die electrical bonding pad and the circuit board electrical bonding pad are electrically interconnected with a fine wire having a diameter of less than about 0.001 inches. Thereafter, the die is coated with a layer of an organic protective coating. The coating is accomplished by forming a mist of the material of the organic protective coating, and depositing the mist onto the die. The fine wire of the wirebond is not disturbed or bent, yet is protected. A thin layer of a conformal coating material such as parylene may be applied over the organic protective coating.

This approach to preparing a chip-on-board electronic device provides an electronic device that is relatively inexpensive to mount and protect, but is fully suitable for spacecraft and other applications where a relatively modest degree of corrosive attack is expected, the device must withstand relatively severe loadings and vibrations, yet weight and volume must be low. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a schematic side elevational view of a chip-on-board electronic device assembly;

FIG. 2 is a block flow diagram of a first embodiment of an approach for practicing the present invention;

FIG. 3 is a schematic side elevational view of a first embodiment of an assembly according to the present invention;

FIG. 5 is a block flow diagram of a second embodiment of an approach for practicing the present invention;

FIG. 6 is a schematic side elevational view of a second embodiment of an assembly according to the present invention;

FIG. 7 is a block flow diagram of a third embodiment of an approach for practicing the present invention; and FIG. 8 is a schematic side elevational view of a third embodiment of an assembly according to the present invention.

DETAILED DESCRIPTION OF THE INVENTION

Figure 4A:
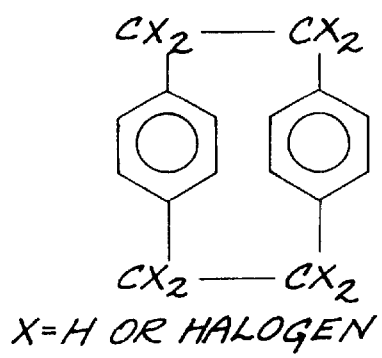
FIGS. 4A–4E are chemical structures, including the general form of the parylene dimer (FIG. 4A), parylene N (FIG. 4B), parylene C (FIG. 4C), parylene D (FIG. 4D), and parylene AF4 (FIG. 4E)

FIG. 1 illustrates a chip-on-board electronic device assembly 20. In this assembly, an electronic device die 22 is affixed to a substrate 24. The electronic device die 22 comprises an electronic circuit element, normally an integrated circuit (IC). Such electronic device dies 22 are known in the art. The substrate 24 is typically a printed circuit board (PCB) made of a nonmetallic material such as a polyimide. Such printed circuit boards are known in the art. Other standalone discrete components 26, such as resistors, capacitors, sensors, and the like, may also be affixed to the substrate 24. Such components are known in the art.

The die 22, the component 26, and external circuit elements are electrically interconnected by either soldering the element to the printed circuit board, or by fine wires 28, sometimes known as wire bonds. The fine wires 28 are usually made of gold, and extend between bonding pads 30, which are usually aluminum, on the die 22 and the component 26. As illustrated, fine wires 28a extend from an external circuit element (not shown) to a bonding pad 30a on the die 22 and to a bonding pad 30b on the component 26. Another fine wire 28b extends from a bonding pad 30c on the die 22 to a bonding pad 30d on the component 26. Wire bonds and techniques for producing such wire bonds are known in the art. Thus, dies 22, substrates 24, components 26, and fine wire wirebonds 28 are known in the art. The present invention does not reside in the structure or arrangement of such elements, but instead in their protection. This illustrated assembly 20 is largely unprotected from mild corrosive attack and other adverse environmental influences.

FIG. 2 depicts a first embodiment of an approach for protecting an assembly as illustrated in FIG. 1, and FIG. 3 illustrates the resulting protected assembly 20a. The electronic device die 22, along with any other components 26, is provided, numeral 40. The substrate 24, such as a printed circuit board, is provided, numeral 42. The electronic device die 22 and any components 26 are affixed to the substrate 24, numeral 44, preferably with a suitable adhesive such as an epoxy.

At least a portion of the die 22 is coated with a layer 60 of silicon oxynitride, numeral 46. At least some of the substrate 24, the component 26, the fine wires 28, and the bonding pads 30 may also be coated with the silicon oxynitride layer 60 in this step 46. The coating step 46 is performed either before or after the affixing step 44. That is, individual elements may be coated with the silicon oxynitride and then affixed to the substrate, or the individual elements may be affixed to the substrate and then the assembly coated with the silicon oxynitride. As used herein, silicon oxynitride is of the form $Si_xN_yO_z$, where x is preferably about 3, y is preferably from about 2.5 to about 4, and z is preferably from 0 to about 0.6. Examples of operable silicon oxynitrides include $Si_3N_4$, $Si_3N_3$, $Si_3N_{2.2}O_{0.12}$, $Si_3N_{2.2}O_{0.4}$, and $Si_3N_{2.6}O_{0.6}$, but the invention is not limited to these particular silicon oxynitrides. The silicon oxynitride is preferably applied by low-temperature plasma enhanced chemical vapor deposition (PECVD). In the low-temperature PECVD process, the assembly to which the silicon oxynitride is applied is heated to no more than about 150° C., a temperature at which most dies 22 and components 26 are not damaged by the heat.

At least one protective coating is applied, numeral 48. The protective coating includes a conformal coating, such as a layer 62 of an organic material such as parylene. The parylene layer 62 is applied over at least some of the die 22, the substrate 24, the components 26, the fine wires 28, and/or the bonding pads 30. The parylene layer 62 is of any operable thickness, but is preferably from about 1000 to about 5000 Angstroms (about 0.1 to about 0.5 micrometers) thick. The parylene layer 62 is applied by any operable process, but it is preferred to apply the parylene layer by plasma-enhanced chemical vapor deposition.

Figure 4B:
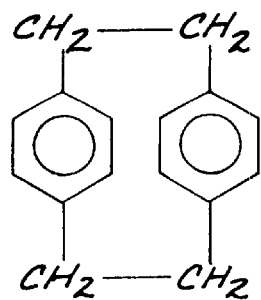
Figure 4C:
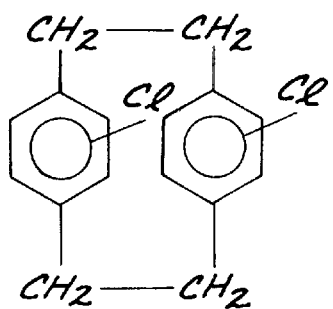
Figure 4D:
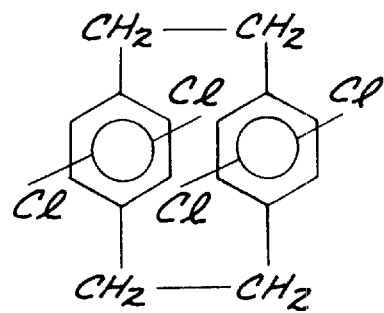
Figure 4E:
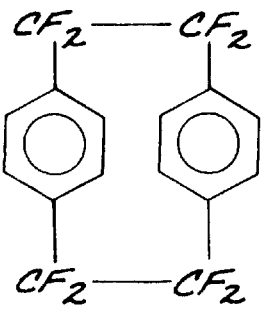

As used herein unless otherwise specified, "parylene" includes all of the parylene coatings such as parylene N, parylene C, parylene D, and substituted parylenes. Parylene is a general term used to describe a class of poly-p-xylylenes which are derived from a dimer having the structure shown generally in FIG. 4A. Operable parylenes include parylene N (FIG. 4B), parylene C (FIG. 4C), parylene D (FIG. 4D), and parylene AF4 (FIG. 4E), a fluorine-substituted dimer also termed octafluoro-(2,2) paracyclophane. Parylene coatings are generally applied from their respective dimers by a well-known deposition process in which the dimer is vaporized, pyrolyzed (i.e., cleaved into the monomer vapor form), and supplied to a deposition chamber wherein the monomer molecules deposit and polymerize onto the substrate in the deposition chamber. The deposition process and the apparatus for deposition are both well known. One form is described in U.S. Pat. No. 5,536,319.

The protective coating may further include an organic overcoat 64 applied over the parylene layer 62. The organic overcoat 64 is applied over at least some of the die 22, the substrate 24, the components 26, the fine wires 28, and/or the bonding pads 30. Preferably, the organic overcoat 64 is applied over at least the wirebond fine wires 28 and bonding pads 30 to protect them, and most preferably covers the entire die and its wire bonds. The organic overcoat 64 is applied by any operable process, but it is preferred to apply the organic overcoat 64 using conventional dispensing equipment As used herein, the "organic overcoat" is any operable organic coating material other than parylene. A preferred organic overcoat is an epoxy.

The elements are electrically interconnected, numeral 50. The electrical interconnection step 50 may be performed before or after the coating step 46 and the protecting step 48. The interconnecting is performed by any operable approach, with wirebonding as shown in FIG. 3 preferred. Wirebonding techniques and materials are well known in the art.

FIGS. 5 and 6 illustrate a second embodiment of the present invention, to prepare an assembly 20b. In these figures, the same numbers are used to correspond to elements previously described, and the previous description is incorporated here. Briefly, the electronic device die 22 is provided, numeral 40. The printed circuit board 24 is provided, numeral 42. The die 22 is affixed to the printed circuit board 24, numeral 44. The elements are electrically interconnected, numeral 50. No silicon oxynitride coating is utilized in this embodiment.

The protective coating is applied, numeral 48'. In this case, the organic overcoat 64 is applied first, typically over the bonding pads 30 on at least the die 22 and optionally over the bonding pads 30 on the component 26 as well. Additional organic overcoating over the die 22, the substrate 24, the components 26, and/or the fine wires 28 is permissible. Optionally, the parylene layer 62 is applied overlying the organic overcoat 64, rather than underlying the organic overcoat 64 as in the embodiment of FIGS. 2–3. The compositions, thicknesses, and procedures are as described in relation to the embodiment of FIGS. 2–3, which discussion is incorporated here.

FIGS. 7 and 8 illustrate a third embodiment of the present invention, to prepare an assembly 20c. In these figures, the same numbers are used to correspond to elements previously described, and the previous description is incorporated here. Briefly, the electronic device die 22 is provided, numeral 40. In providing the die 22, a nickel/gold layer 80 is applied overlying the wire bonding pads 30. The nickel/gold layer 80 protects the wire bonding pads. This layer 80 includes a first sublayer of nickel contacting the wire bonding pads 30, and a second sublayer of gold overlying the nickel sublayer. The nickel/gold layer 80 is of any operable thickness, but is preferably from about 20 microinches to about 40 microinches thick. The nickel/gold layer 80 is applied by any operable process, but it is preferred to apply the nickel/gold layer 80 by either electrodeposition or sputtering.

The printed circuit board 24 is provided, numeral 42. The die 22 is affixed to the printed circuit board 24, numeral 44. The elements are electrically interconnected, numeral 50. No silicon oxynitride coating is utilized in this embodiment. The protective coating is applied, numeral 48". In this case, the protective coating is the parylene layer 62, with no organic overcoat present. The compositions, thicknesses, and procedures are as described in relation to the embodiment of FIGS. 2–3, which discussion is incorporated here.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of preparing a chip-on-board electronic device assembly, comprising the steps of
    providing an electronic device die having a top surface and having an electronic circuit element thereon, the electronic circuit element having a die electrical bonding pad thereon;
    providing a printed circuit board having a circuit board electrical bonding pad thereon;
    affixing the die to the printed circuit board;
    coating at least a portion of the die with a layer of silicon oxynitride that directly contacts the top surface of the die; and
    applying a layer of parylene overlying the layer of silicon oxynitride; and
    electrically interconnecting the die electrical bonding pad and the circuit board electrical bonding pad with a wire.

2. The method of claim 1, wherein the step of coating is performed prior to the step of affixing.

3. The method of claim 1, wherein the step of coating is performed after the step of affixing.

4. The method of claim 1, wherein the step of electrically interconnecting is performed before the step of coating.

5. The method of claim 1, wherein the step of electrically interconnecting is performed after the step of coating.

6. The method of claim 1, wherein the step of applying includes the step of
    applying the layer of parylene by plasma-enhanced chemical vapor deposition.

7. The method of claim 1, further including an additional step of
    applying a layer of parylene overlying the layer of silicon oxynitride, the layer of parylene having a thickness of from about 0.1 to about 0.5 micrometers.

8. The method of claim 7, further including an additional step of applying a layer of a conformal coating of an organic material overlying the layer of parylene.

9. The method of claim 7, further including an additional step of applying a layer of a conformal coating of an organic material overlying the layer of parylene, the layer of the conformal coating having a thickness of from about 0.1 to about 0.5 micrometers.

10. The method of claim 1, further including an additional step of
    applying a layer of a conformal coating of an organic material overlying the layer of silicon oxynitride, the layer of the conformal coating having a thickness of from about 0.1 to about 0.5 micrometers.

11. A method of preparing a chip-on-board electronic device assembly, comprising the steps of
    providing an electronic device die having a top surface and having an electronic circuit element thereon, the electronic circuit element having a die electrical bonding pad thereon;
    providing a printed circuit board having a circuit board electrical bonding pad thereon;
    affixing the die to the printed circuit board;
    electrically interconnecting the die electrical bonding pad and the circuit board electrical bonding pad with a wire; thereafter
    coating at least a portion of the die with a layer of an organic protective coating other than parylene, wherein the layer of the organic protective coating directly contacts the top surface of the die, the step of coating including the steps of
        forming a mist of the material of the organic protective coating, and
        depositing the mist onto the die, and
    applying a layer of organic parylene overlying and contacting the layer of the organic protective coating, the layer of parylene having a thickness of from about 0.1 to about 0.5 micrometers.

12. The method of claim 11, wherein the step of applying includes the step of
    applying the layer of parylene by plasma-enhanced chemical vapor deposition.

13. A method of preparing a chip-on-board electronic device assembly, comprising the steps of
    providing an electronic device die having an electronic circuit element thereon, the electronic circuit element having a die electrical bonding pad thereon, wherein the die electrical bonding pad has a nickel/gold layer deposited thereon;
    providing a printed circuit board having a circuit board electrical bonding pad thereon;
    affixing the die to the printed circuit board;
    electrically interconnecting the die electrical bonding pad and the circuit board electrical bonding pad with a wire; and
    applying a layer of parylene as a protective coating overlying the die and the wire, there being no silicon nitride present in the protective coating.

14. The method of claim 13, wherein the step of applying includes the step of
    applying the layer of parylene by plasma-enhanced chemical vapor deposition.

15. The method of claim 13, further including an additional step of
   applying the layer of parylene having a thickness of from about 0.1 to about 0.5 micrometers.

16. The method of claim 13, further including an additional step of
   applying a layer of a conformal coating of an organic material having a thickness of from about 0.1 to about 0.5 micrometers.

17. The method of claim 13, wherein the wire is gold.

* * * * *